US009893022B2

(12) United States Patent
Cao et al.

(10) Patent No.: US 9,893,022 B2
(45) Date of Patent: Feb. 13, 2018

(54) SELF-DESTRUCTIVE CIRCUITS UNDER RADIATION

(71) Applicant: International Business Machines Corporation, Armonk, NY (US)

(72) Inventors: Qing Cao, Yorktown Heights, NY (US); Kangguo Cheng, Schenectady, NY (US); Fei Liu, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/596,551

(22) Filed: May 16, 2017

(65) Prior Publication Data

US 2017/0250142 A1 Aug. 31, 2017

Related U.S. Application Data

(62) Division of application No. 14/750,636, filed on Jun. 25, 2015, now Pat. No. 9,685,417.

(51) Int. Cl.
*H01L 23/29* (2006.01)
*H01L 23/00* (2006.01)
*H01L 21/56* (2006.01)

(52) U.S. Cl.
CPC ............ *H01L 23/573* (2013.01); *H01L 21/56* (2013.01); *H01L 23/295* (2013.01)

(58) Field of Classification Search
CPC ..... H01L 23/573; H01L 21/56; H01L 23/295; H01L 23/28
USPC .......................................................... 257/789
See application file for complete search history.

(56) References Cited

U.S. PATENT DOCUMENTS

| | | | |
|---|---|---|---|
| 7,388,201 B2 | 6/2008 | Cholewa et al. | |
| 8,332,661 B2 | 12/2012 | Mostovych | |
| 8,465,201 B2 | 6/2013 | Imholt | |
| 8,629,770 B2 | 1/2014 | Hummer et al. | |
| 9,685,417 B2 * | 6/2017 | Cao | H01L 23/573 |
| 2006/0202168 A1 | 9/2006 | Barrera et al. | |
| 2008/0266734 A1 | 10/2008 | Miller | |
| 2011/0003279 A1 | 1/2011 | Patel | |

OTHER PUBLICATIONS

A. Le Louarn et al., "Intrinsic current gain cutoff frequency of 30GHz with carbon nanotube transistors," Applied Physics Letters, vol. 90, No. 23, Jun. 2007, 233108, 3 pages.

B. Chandra et al., "Stable charge-transfer doping of transparent single-walled carbon nanotube films," Chemistry of Materials, vol. 22, No. 18, Sep. 2010, pp. 5179-5183.

(Continued)

*Primary Examiner* — Caleen Sullivan

(74) *Attorney, Agent, or Firm* — Vazken Alexanian; Michael J. Chang, LLC

(57) ABSTRACT

Circuits which self-destruct under radiation are provided. In one aspect, a method for creating a radiation-sensitive circuit is provided. The method includes the step of: connecting an integrated circuit to a power supply and to a ground in parallel with at least one dosimeter device, wherein the dosimeter device is configured to change from being an insulator to being a conductor under radiation. Radiation-sensitive circuits are also provided.

20 Claims, 5 Drawing Sheets

Voltage supply
chip packaging
dosimeter
metal contacts
Ground

(56) References Cited

OTHER PUBLICATIONS

J. M. Lobez et al., "Radiation detection: Resistivity responses in functional poly (olefin sulfone)/carbon nanotube composites," Angewandte Chemie, vol. 122, No. 1, Jan. 2010, pp. 99-102.

M. Ambrosio et al., "A novel photon detector made of silicon and carbon nanotubes," Nuclear Instruments and Methods in Physics Research A. vol. 617, No. 1, 2010, pp. 378-380 (Published Jul. 2009).

Heffner, "Radiation Induced Degradation Pathways for Poly (Methyl Methacrylate) and Polystyrene Polymers as Models for Polymer Behavior in Space Environments," Graduate Theses and Dissertations, University of South Florida (Nov. 2003), 172 pages.

A.L. Boni, "A Polyacrylamide Gamma Dosimeter," Radiation Research vol. 14, No. 4, 374-380 (Apr. 1961).

List of IBM Patents or Applications Treated as Related (2 pages).

* cited by examiner

SELF-DESTRUCTIVE CIRCUITS UNDER RADIATION

CROSS-REFERENCE TO RELATED APPLICATION(S)

This application is a divisional of U.S. application Ser. No. 14/750,636 filed on Jun. 25, 2015, the disclosure of which is incorporated by reference herein.

FIELD OF THE INVENTION

The present invention relates to self-destructive circuits, and more particularly, to self-destructive circuits under radiation using carbon nanotube-based dosimeter devices.

BACKGROUND OF THE INVENTION

Many field-effect transistor (FET) chips can be used for both commercial and military applications. For instance, chips made using silicon-on-insulator (SOI) technology can be employed for general commercial use, as well as in environments such as aerospace applications requiring radiation hardened devices. Government regulations, however, sometimes specify that these devices be sold only for commercial use and that military applications are prohibited. An effective way to prevent unauthorized usage is to be able to render the chips inoperable when they are used for an unintended purpose, such as non-commercial use in a radiation hardening environment.

Thus, techniques for providing a mechanism for chips to self-destruct when used in an unauthorized manner would be desirable.

SUMMARY OF THE INVENTION

The present invention provides self-destructive circuits under radiation using carbon nanotube-based dosimeter devices. In one aspect of the invention, a method for creating a radiation-sensitive circuit is provided. The method includes the step of connecting an integrated circuit to a power supply and to a ground in parallel with at least one dosimeter device, wherein the at least one dosimeter device is configured to change from being an insulator to being a conductor under radiation. The method may further include the step of: irradiating the radiation-sensitive circuit to change the at least one dosimeter device from being an insulator to being a conductor and thereby establishing a direct connection between the power supply and the ground which destroys the radiation-sensitive circuit.

In another aspect of the invention, another method for creating a radiation-sensitive circuit is provided. The method includes the step of: connecting an integrated circuit to a power supply and to a ground in parallel with at least one first dosimeter device and at least one second dosimeter device, wherein the at least one first dosimeter device is configured to change from being an insulator to being a conductor under a first type of radiation, and wherein the at least one second dosimeter device is configured to change from being an insulator to being a conductor under a second type of radiation.

In yet another aspect of the invention, a radiation-sensitive circuit is provided. The circuit includes: an integrated circuit connected to a power supply and to a ground in parallel with at least one dosimeter device, wherein the at least one dosimeter device is configured to change from being an insulator to being a conductor under radiation to establish a direct connection between the power supply and the ground.

A more complete understanding of the present invention, as well as further features and advantages of the present invention, will be obtained by reference to the following detailed description and drawings.

DETAILED DESCRIPTION OF PREFERRED EMBODIMENTS

As provided above, an effective mechanism to prevent the unauthorized use of a chip is to render the chip inoperable when the chip is used other than for its intended purpose. For example, with commercial use (e.g., use by consumers) chips typically are not exposed to high levels of radiation. However, for military applications the same chips might be used in radiation hardening environments. The term 'radiation hardening environments' refers to environments where high levels of ionizing radiation are present, such as in outer space or in high-altitude flight. Thus, in that case, a simple and effective way to prevent non-commercial use of these chips is to provide a self-destruct feature which renders the chip inoperable if it is ever exposed to high levels of radiation (as would be the case if the chip was ever used in a radiation hardening environment). By self-destruct it is implied that the chip and/or components related to use of the chip are destroyed and thus rendered permanently inoperable.

More specifically, the present techniques involve integrating a carbon nanotube-based dosimeter (radiation-sensing) device into a semiconductor chip circuit. The dosimeter device functions generally by changing its conductivity when exposed to ionizing radiation thereby creating a radiation-sensitive circuit. Namely, when exposed to high levels of radiation, the dosimeter device changes from being an insulator to being a conductor. According to an exemplary embodiment, this feature is exploited at the package level where the dosimeter device, upon exposure to radiation, provides a direct path between the power supply and ground. As a result, the power supply and/or the chip will be destroyed. This provides a simple and effective way to prevent unauthorized use of the present dosimeter-equipped semiconductor chip circuits in high radiation environments.

Further, the configuration of the present dosimeter device allows for selective detection of different types and/or amounts (i.e., sensitivity) of radiation. Namely, as will be described in detail below, the radiation sensitivity of the dosimeter device is provided via an encapsulant on the carbon nanotubes that, when present, reduces conductivity through the carbon nanotubes. Upon exposure to radiation, however, the encapsulant breaks down decreasing the resistance through the dosimeter device. The amount of encapsulant and/or the composition of the encapsulant can be varied to change the sensitivity of the dosimeter, to detect certain types of radiation, etc.

Figure 1:
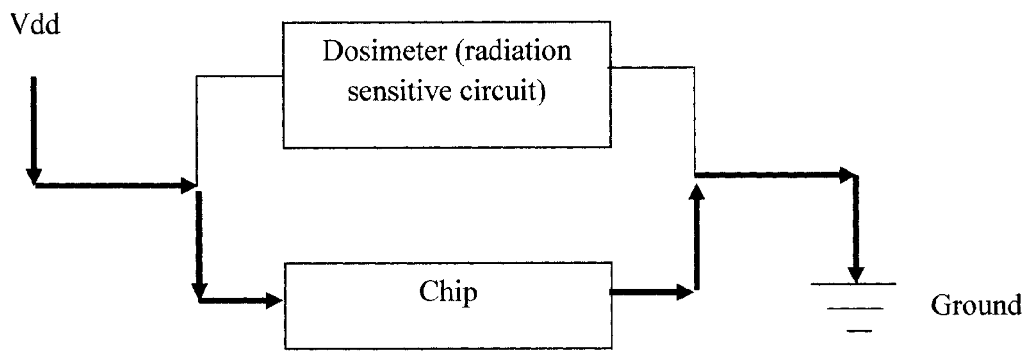
FIG. 1 is a diagram illustrating a carbon nanotube-based dosimeter device having been placed in circuit with a chip between a power supply (Vdd) and ground according to an embodiment of the present invention.
Figure 2:
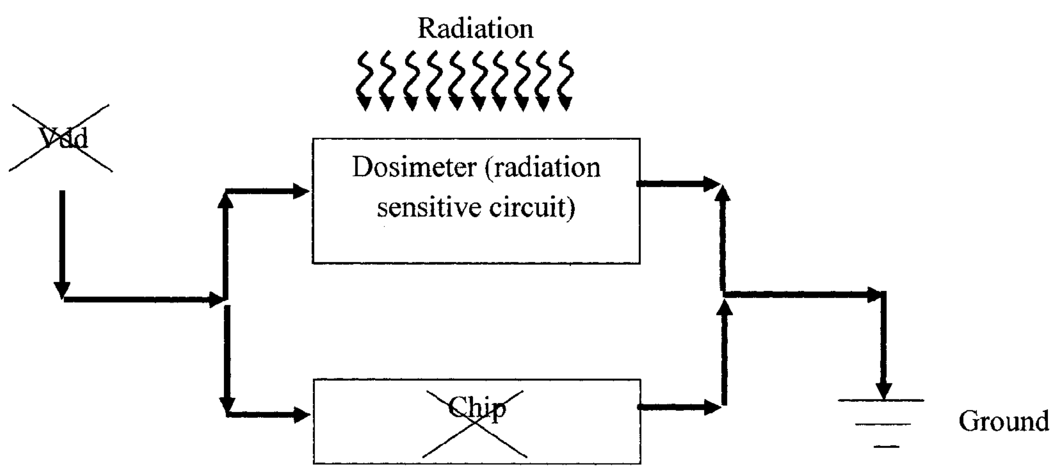
FIG. 2 is a diagram illustrating how, when the dosimeter device is exposed to high levels of radiation, it changes from being a conductor to being an insulator according to an embodiment of the present invention.

An exemplary embodiment of the present techniques is now described by way of reference to FIGS. 1 and 2. As shown in FIG. 1, the present carbon nanotube-based dosimeter device is placed in circuit with a chip between a power supply (Vdd) and ground. Under low radiation conditions, the dosimeter acts as an insulator, and current flows from the power supply to the ground through only the chip.

However, when the dosimeter is exposed to high levels, e.g., above 5000 rads, of radiation it changes from being a conductor to being an insulator. As shown in FIG. 2, this provides a direct link between the power supply (Vdd) and ground. This can serve to damage the power supply due to overloading and/or damage the chip due to thermal heating. In either case, the device is no longer functional. Further, the change to the dosimeter (from insulator to a conductor) is permanent and thus the device will remain permanently non-functional.

Figure 3:
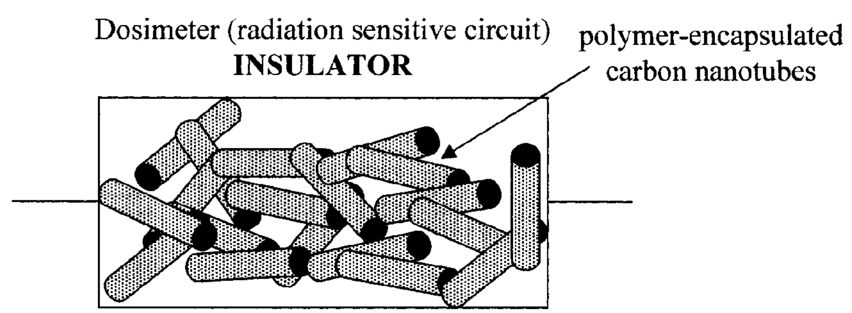
FIG. 3 is a diagram illustrating an as-formed dosimeter device according to an embodiment of the present invention.
Figure 4:
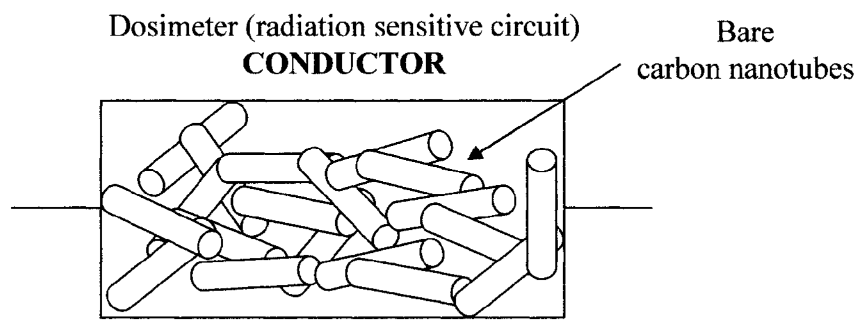
FIG. 4 is a diagram illustrating a dosimeter device after it has been exposed to radiation according to an embodiment of the present invention.

More detailed depictions of the present dosimeter device are provided in FIGS. 3 and 4. For clarity of depiction, the carbon nanotubes are not drawn to scale in the figures but are shown magnified to better illustrate the configuration of the dosimeter.

As shown in FIG. 3, the dosimeter device includes an array or a mat of carbon nanotubes. According to an exemplary embodiment, the carbon nanotubes are commercially available conductive multi-walled semiconducting carbon nanotubes. The carbon nanotubes are coated with a layer of an insulating polymer. Therefore, when the carbon nanotubes are covered with the polymer, the dosimeter device is insulating. The polymer selected however is one that degrades in the presence of ionizing radiation. See, for example, Lobez et al., "Radiation Detection: Resistivity Responses in Functional Poly (Olefin Sulfone)/Carbon Nanotube Composites," Angewandte Chemie, International Edition, Vol. 49, Issue 1, pgs. 95-98 (January 2010) (hereinafter "Lobez"), the contents of which are incorporated by reference herein—which describes how irradiation induces chain-scission and depolymerization in materials such as poly(olefin sulfone)s. Accordingly, in the presence of ionizing radiation, the polymer breaks down, leaving behind bare carbon nanotubes. See FIG. 4. The now-exposed carbon nanotubes serve as a conductor—completing the circuit through the dosimeter between the power supply and ground (see FIG. 2).

Figure 5:
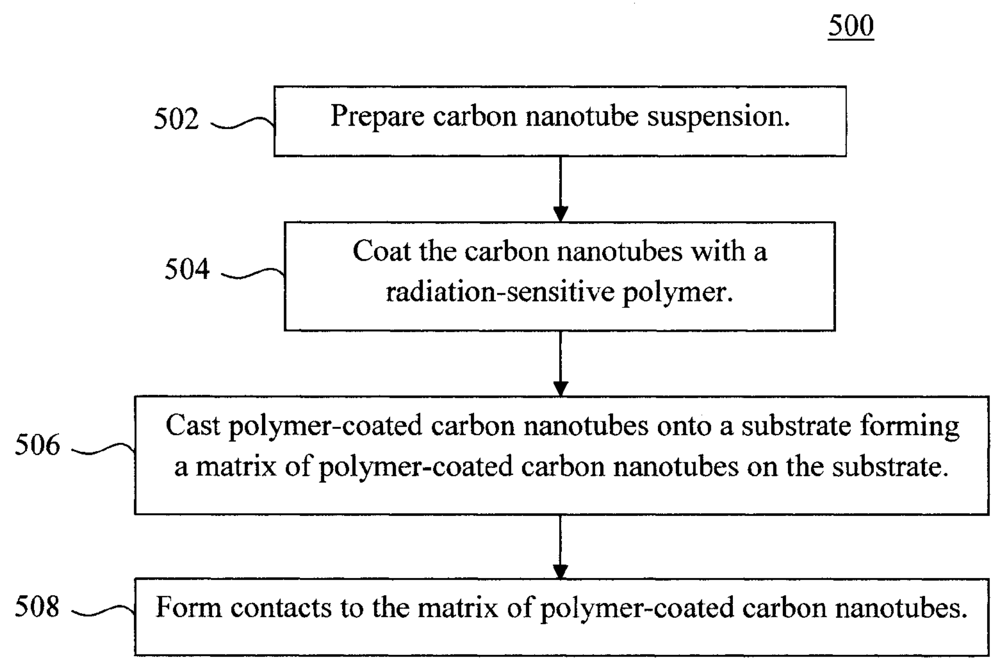
FIG. 5 is a diagram illustrating an exemplary methodology for forming the dosimeter device according to an embodiment of the present invention.

FIG. 5 is a diagram illustrating an exemplary methodology 500 for forming the present dosimeter device. In step 502 a suspension of (commercially available) carbon nanotubes is prepared in a solvent. Suitable solvents include, but are not limited to, water, isopropyl alcohol or an organic solvent such as tetrahydrofuran (THF).

In step 504, the carbon nanotubes are then contacted with the polymer. According to an exemplary embodiment, the carbon nanotubes and the polymer are contacted simply by mixing the polymer and the carbon nanotubes together in the solvent. See, for example, Lobez. As provided above, the polymer must be sensitive to ionizing radiation—i.e., the polymer must break down when exposed to ionizing radiation. Further, as provided above, the dosimeter device may be configured to respond to different types of radiation. Different polymers are sensitive to different types of radiation. By way of example only, poly(olefin sulfone)s and polyacrylamide are sensitive to gamma radiation, whereas poly (methyl methacrylate) (PMMA) breaks down in the presence of beta radiation. See, for example, Heffner, "Radiation Induced Degradation Pathways for Poly (Methyl Methacrylate) and Polystyrene Polymers as Models for Polymer Behavior in Space Environments," Graduate Theses and Dissertations, University of South Florida (November 2003), the contents of which are incorporated by reference as if fully set forth herein. See also, A. L. Boni, "A Polyacrylamide Gamma Dosimeter," Radiation Research vol. 14, no. 4, 374-380 (April 1961), the contents of which are incorporated by reference as if fully set forth herein.

By contacting the carbon nanotubes with the polymer, the polymer forms a coating on the carbon nanotubes. The exemplary polymers provided above are insulating materials. As such, this coating on the nanowires renders the carbon nanotubes non-conductive.

In step 506, the polymer-coated carbon nanotubes are then cast onto a substrate. Suitable substrates include, but are not limited to insulating materials, such as oxide substrates. The term 'substrate' generally refers herein to any structure on which the present dosimeter device is to be formed. For instance, as will be described in detail below, the present dosimeter device may be incorporated at the package level of a chip circuit. In that case, the substrate is the chip package. Namely, as known in the art, a chip package is often formed from a dielectric material(s) deposited onto a chip. This can be done at the die level or at the wafer level. Accordingly, the present dosimeter device may be formed on the chip package, i.e., using the chip package as a substrate.

Once the solvent evaporates, the polymer-coated carbon nanotubes cast onto the substrate will form an interconnected matrix of carbon nanotubes. See, for example, FIG. 3. However, due to the (insulating) polymer coating on the carbon nanotubes, the matrix is insulating and will not pass current.

In step 508, contacts are formed to the matrix of polymer-coated carbon nanotubes. According to an exemplary embodiment, two contacts are formed contacting opposite sides of the matrix. By way of example only, the contacts can be formed by plating a metal or combination of metals onto the substrate, in contact with the matrix. Other suitable techniques for depositing contact metals include, but are not limited to, evaporation and sputtering. Suitable contact metals include gold, platinum, palladium, nickel, etc. Once formed, the contact can be connected (e.g., by wire) to the chip circuit. For example, as provided above, the dosimeter device can be connected in circuit with the chip between the power supply and ground. See, for example, FIG. 1.

Figure 6:
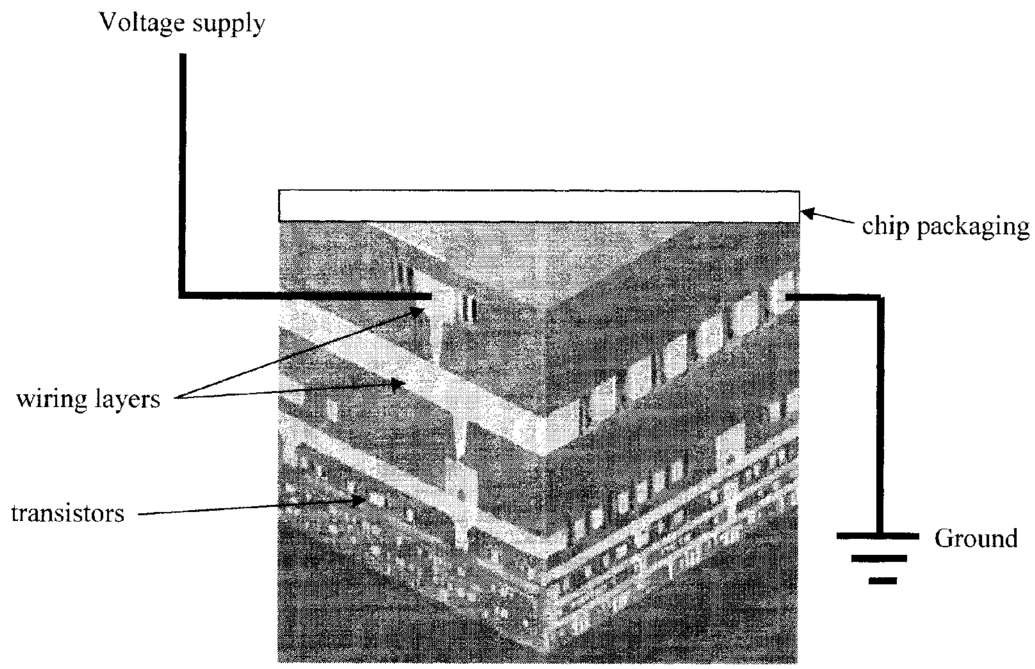
FIG. 6 is a diagram illustrating an exemplary integrated circuit connected to both power and ground according to an embodiment of the present invention.

An exemplary embodiment for integrating the present dosimeter device into the packing layer of an integrated circuit is now described by way of reference to FIGS. 6-9. As shown in FIG. 6, the process begins with an integrated circuit which has been fabricated by conventional processes. By way of example only, the integrated circuit contains multiple transistor devices interconnected by various wiring layers. For instance, the integrated circuit might be a microprocessor chip. It is assumed that the overall structure of an integrated circuit, such as a microprocessor chip, is well known in the art and thus is not described further herein. As shown in FIG. 6, the integrated circuit is connected to a power supply and to ground.

As also shown in FIG. 6, a packaging is present on the chip. As provided above, the chip package is often formed from a dielectric material(s) deposited onto (and encasing) a chip. For instance, epoxy polymers are an industry standard chip packaging material.

Figure 7:
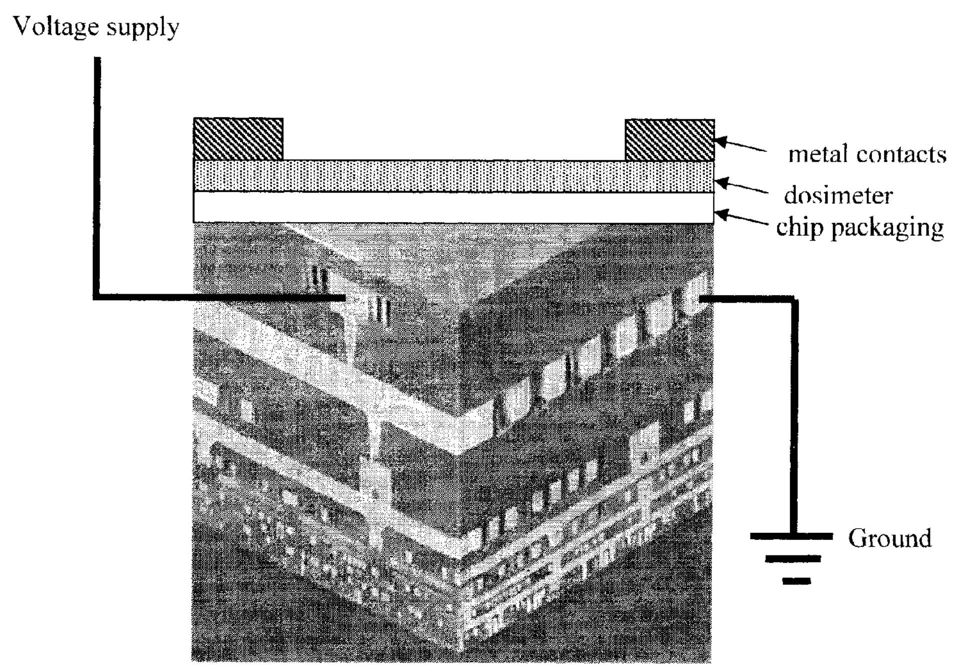
FIG. 7 is a diagram illustrating at least one dosimeter device having been formed in the packaging level of the integrated circuit according to an embodiment of the present invention.

Referring to FIG. 7, at least one of the present carbon nanotube-based dosimeter devices is formed on the chip package. The steps for fabricating the dosimeter device were described in detail in conjunction with the description of FIG. 5, above. In this case, the chip packaging is the 'substrate' on which the dosimeter device is formed. As described above, the dosimeter device contains a matrix of interconnected polymer-coated carbon nanotubes. The polymer is an insulating material, such that even though the carbon nanotubes are interconnected—the dosimeter device acts as an insulator. The polymer is however radiation-sensitive in that the polymer degrades when exposed to ionizing radiation. Therefore, when exposed to ionizing radiation, the polymer breaks down. Without the polymer coating, the carbon nanotubes then form an interconnected conductive path through the dosimeter (i.e., once the dosimeter is exposed to radiation it becomes a conductor). Further, as described above, contacts are formed to the polymer-coated carbon nanotube matrix. In the example shown in FIG. 7, the contacts are metal contacts which are formed on opposite sides of the matrix.

Figure 8:
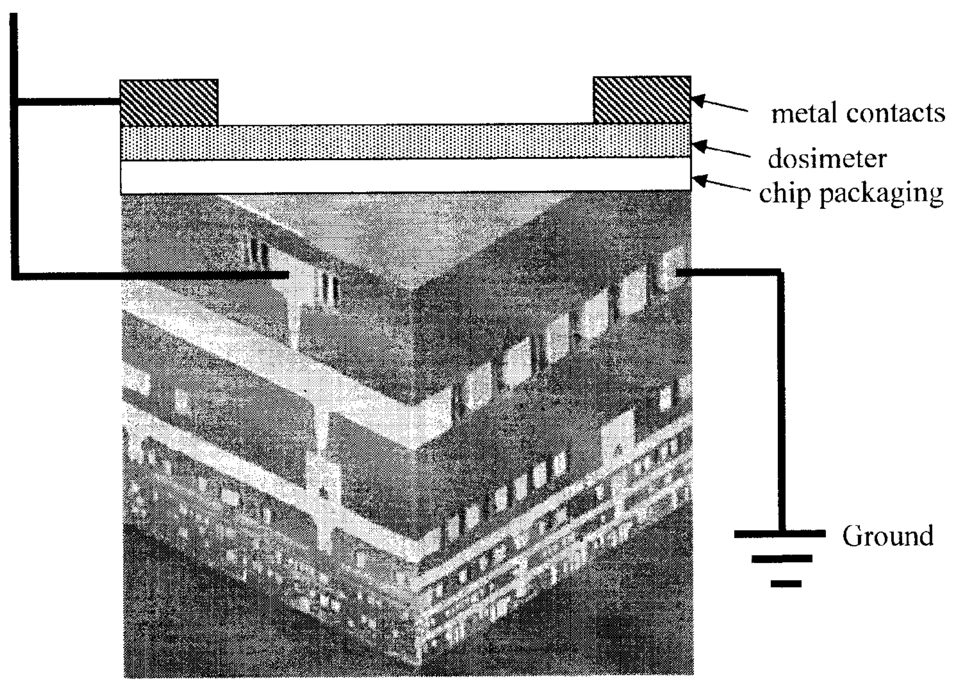
FIG. 8 is a diagram illustrating a first metal contact of the dosimeter device having been connected to the power supply according to an embodiment of the present invention.
Figure 9:
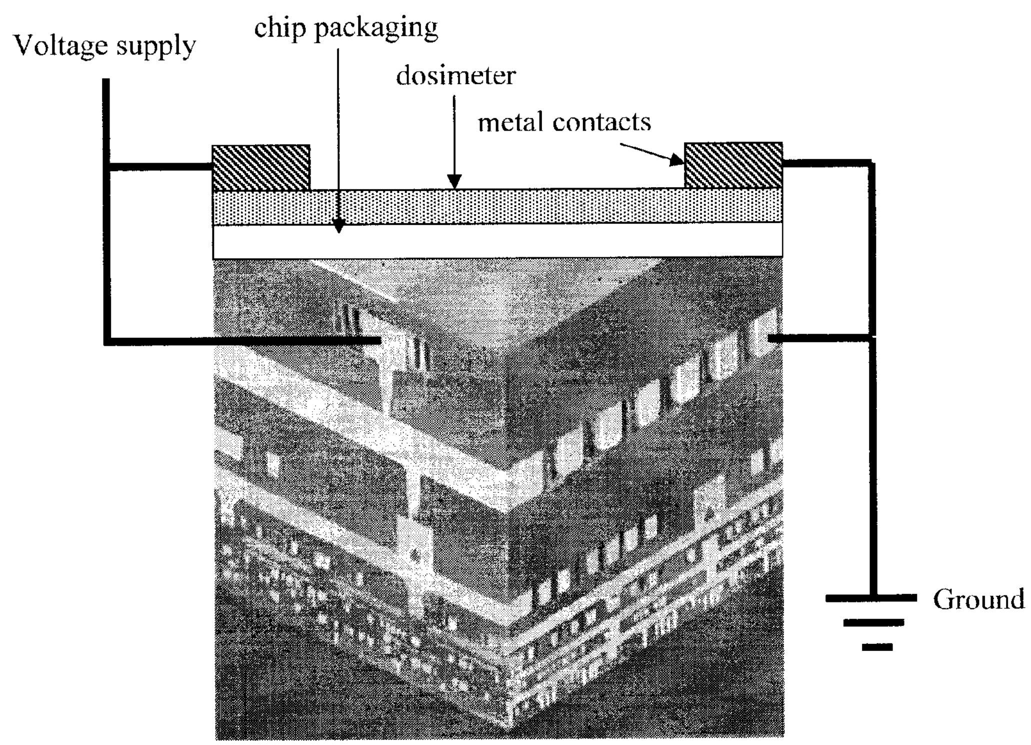
FIG. 9 is a diagram illustrating a second metal contact of the dosimeter device having been connected to ground according to an embodiment of the present invention.

As shown in FIG. 8, one of the (in this case two contacts) is connected to the voltage supply. The other contact is then connected to ground. See FIG. 9. As shown in FIG. 9, this configuration results in the dosimeter device and the integrated circuit being connected in parallel to both the power supply and to ground. As formed, the dosimeter device will act as an insulator. Thus, current flow from the power supply to ground occurs through only the integrated circuit. However, upon exposure to ionizing radiation, the polymer coating on the carbon nanotubes of the dosimeter will break down, providing direct contact between the carbon nanotubes in the matrix. The dosimeter will then act as a conductor. As a result, the power supply will likely be damaged due to overloading. The integrated circuit will also be damaged due to overheating. The integrated circuit will then be rendered non-functional.

As provided above, the radiation-sensitive polymer used to coat the carbon nanotubes can be selected based on its sensitivity to certain types of radiation. In the example provided above, polymers such as poly(olefin sulfone)s are sensitive to gamma radiation, whereas PMMA is sensitive to beta radiation. Thus, depending on the particular application at hand, one could select a given radiation-sensitive polymer to use during the fabrication process in order to provide selectivity in detecting a particular type of radiation.

Figure 10:
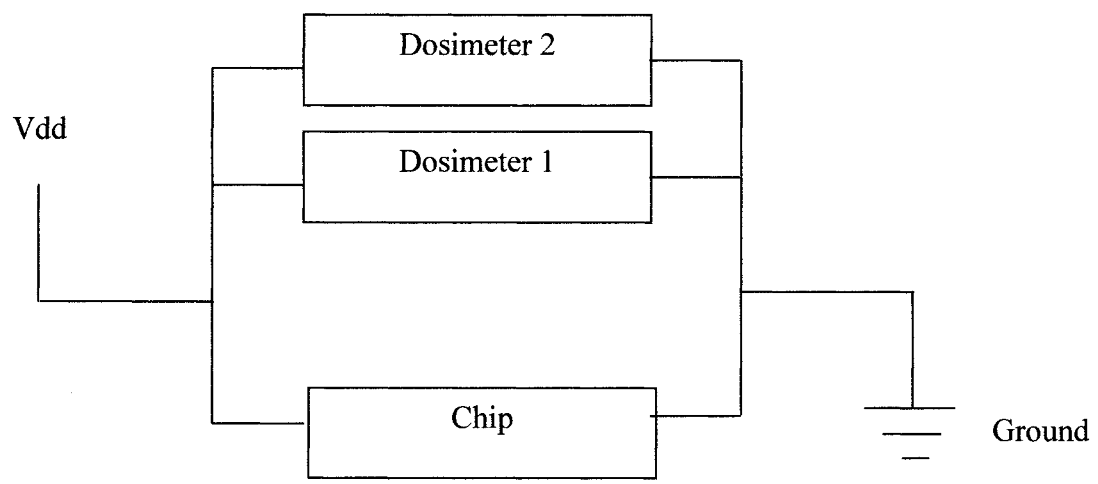
FIG. 10 is a diagram illustrating multiple dosimeter devices being employed in a circuit according to an embodiment of the present invention.

On the other hand, one might want the dosimeter to be responsive to multiple types of ionizing radiation. For instance, aerospace applications might involve exposure to both beta and gamma radiation. As such, multiple dosimeter devices may be fabricated and implemented (in the same manner as described above) in order to provide sensitivity to different types of ionizing radiation. See, for example, FIG. 10. Specifically, in the example shown in FIG. 10 there are two dosimeters (Dosimeter 1 and Dosimeter 2) being employed in the circuit. Of course this is only an example, and more than two dosimeter devices can be implemented in the same manner.

By way of example only, the first dosimeter device can include carbon nanotubes coated with a first radiation-sensitive polymer. The second dosimeter device can include carbon nanotubes coated with a second radiation-sensitive polymer. The first radiation sensitive polymer is preferably different from the second radiation-sensitive polymer. For instance, the first radiation sensitive polymer may be sensitive to (i.e., may degrade in the presence of) one type of ionizing radiation, whereas the second radiation-sensitive polymer may be sensitive to (i.e., may degrade in the presence of) another type of ionizing radiation. To use a simple, non-limiting, example to illustrate this point: the first dosimeter device can employ poly(olefin sulfone)s as the polymer coating its carbon nanotubes. The second dosimeter device can employ PMMA as the polymer coating its carbon nanotubes. The combination of Dosimeter 1 and Dosimeter 2 in that example would be sensitive to gamma and beta radiation, respectively. Thus, if either beta or gamma radiation is encountered, the respective dosimeter device will be transformed from being an insulator to being a conductor between the power supply and ground. As a result, the circuit will be destroyed.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A radiation-sensitive circuit, comprising:

an integrated circuit connected to a power supply and to a ground in parallel with at least one dosimeter device, wherein the at least one dosimeter device is configured to change from being an insulator to being a conductor under radiation to establish a direct connection between the power supply and the ground.

2. The radiation-sensitive circuit of claim 1, wherein the at least one dosimeter device comprises a matrix of carbon nanotubes coated in a radiation-sensitive polymer, wherein the radiation-sensitive polymer is configured to decompose under radiation.

3. The radiation-sensitive circuit of claim 2, wherein the radiation-sensitive polymer is electrically insulating.

4. The radiation-sensitive circuit of claim 2, wherein the radiation-sensitive polymer is selected from the group consisting of: poly(olefin sulfone)s, polyacrylamide, and PMMA.

5. The radiation-sensitive circuit of claim 2, wherein the matrix of carbon nanotubes comprise conductive multi-walled semiconducting carbon nanotubes.

6. The radiation-sensitive circuit of claim 2, further comprising:

at least one first metal contact and the at least one second metal contact formed on opposite sides of the matrix of the polymer-coated carbon nanotubes.

7. The radiation-sensitive circuit of claim 6, wherein the at least one first metal contact and the at least one second metal contact each comprises a metal selected from the group consisting of: gold, platinum, palladium, and nickel.

8. The radiation-sensitive circuit of claim 6, wherein the at least one first metal contact is connected to the power supply, and wherein the at least one second metal contact is connected to the ground.

9. The radiation-sensitive circuit of claim 1, wherein the integrated circuit is connected to the power supply and to the ground in parallel with multiple dosimeter devices, wherein each of the dosimeter devices is configured to change from being an insulator to being a conductor under a given type of radiation.

10. The radiation-sensitive circuit of claim 9, wherein the multiple dosimeter devices comprise at least one first dosimeter device and at least one second dosimeter device.

11. The radiation-sensitive circuit of claim 10, wherein the at least one first dosimeter device comprises a first matrix of carbon nanotubes coated in a first radiation-sensitive polymer, wherein the first radiation-sensitive polymer is configured to decompose under a first type of radiation.

12. The radiation-sensitive circuit of claim 11, wherein the at least one second dosimeter device comprises a second matrix of carbon nanotubes coated in a second radiation-sensitive polymer, wherein the second radiation-sensitive polymer is configured to decompose under a second type of radiation.

13. The radiation-sensitive circuit of claim 12, wherein the first radiation-sensitive polymer is poly(olefin sulfone)s or polyacrylamide, and the second radiation-sensitive polymer is PMMA, and wherein the first type of radiation is gamma radiation and the second type of radiation is beta radiation.

14. A radiation-sensitive circuit, comprising:

an integrated circuit connected to a power supply and to a ground in parallel with at least one first dosimeter device and at least one second dosimeter device, wherein the at least one first dosimeter device is configured to change from being an insulator to being a conductor under a first type of radiation, and wherein the at least one second dosimeter device is configured to change from being an insulator to being a conductor under a second type of radiation.

15. The radiation-sensitive circuit of claim 14, wherein the at least one first dosimeter device comprises a first matrix of carbon nanotubes coated in a first radiation-sensitive polymer, and wherein the first radiation-sensitive polymer is configured to decompose under the first type of radiation.

16. The radiation-sensitive circuit of claim 15, wherein the at least one second dosimeter device comprises a second matrix of carbon nanotubes coated in a second radiation-sensitive polymer, wherein the second radiation-sensitive polymer is configured to decompose under the second type of radiation.

17. The radiation-sensitive circuit of claim 16, wherein the first radiation-sensitive polymer and the second radiation-sensitive polymer are electrically insulating.

18. The radiation-sensitive circuit of claim 16, wherein the first matrix of carbon nanotubes and the second matrix of carbon nanotubes each comprises conductive multi-walled semiconducting carbon nanotubes.

19. The radiation-sensitive circuit of claim 16, wherein the first radiation-sensitive polymer is poly(olefin sulfone)s or polyacrylamide, and the first type of radiation is gamma radiation.

20. The radiation-sensitive circuit of claim 16, wherein the second radiation-sensitive polymer is PMMA, and the second type of radiation is beta radiation.

* * * * *